United States Patent [19]

Schieber et al.

[11] 4,094,268

[45] June 13, 1978

[54] APPARATUS FOR GROWING HGI$_2$ CRYSTALS

[75] Inventors: Michael M. Schieber; Israel Beinglass; Giora Dishon, all of Jerusalem, Israel

[73] Assignee: United States Department of Energy, Washington, D.C.

[21] Appl. No.: 782,875

[22] Filed: Mar. 30, 1977

Related U.S. Application Data

[62] Division of Ser. No. 681,639, Apr. 29, 1976, Pat. No. 4,030,964.

[51] Int. Cl.$^2$ .................. B01J 17/30; C01G 13/04
[52] U.S. Cl. ..................... 118/49.1; 118/49.5; 23/273 R; 156/610
[58] Field of Search ............... 156/600, 601, 610, 611, 156/612, DIG. 82; 23/305 R, 273 R, 294; 118/48, 49, 49.1, 49.5; 423/491

[56] References Cited

U.S. PATENT DOCUMENTS

| | | | |
|---|---|---|---|
| 2,813,811 | 11/1957 | Sears | 156/610 |
| 3,206,406 | 9/1965 | Barkemeyer | 156/610 |
| 3,213,827 | 10/1965 | Jenkin | 118/49.5 |
| 3,240,915 | 3/1966 | Carter | 118/49.1 |
| 3,243,267 | 3/1966 | Piper | 156/610 |
| 3,329,524 | 7/1967 | Smith | 156/610 |
| 3,591,346 | 7/1971 | Kluckow | 156/610 |
| 3,617,371 | 11/1971 | Burmeister | 118/49.5 |
| 3,632,429 | 1/1972 | Maeda | 156/610 |
| 3,661,117 | 5/1972 | Cornelius | 118/48 |

FOREIGN PATENT DOCUMENTS

| | | | |
|---|---|---|---|
| 669,861 | 9/1965 | Belgium | 156/610 |
| 2,276,872 | 1/1976 | France | 156/DIG. 82 |
| 944,052 | 12/1963 | United Kingdom | 156/610 |

OTHER PUBLICATIONS

Schieber et al., J. of Cryst. Growth, 24/25 (1974), pp. 205–211.
Scholz, Cryst. Growth Conf., 1966, Supp. to Phy. & Chem. of Solids, Pergamon, 1967, pp. 475–482.
Ponpon, IEEE Trans. on Nuclear Sci., vol. NS-22, Feb. 1975, pp. 182–191.

*Primary Examiner*—Stephen J. Emery
*Attorney, Agent, or Firm*—Dean E. Carlson; John A. Koch

[57] ABSTRACT

A method and horizontal furnace for vapor phase growth of HgI$_2$ crystals which utilizes controlled axial and radial airflow to maintain the desired temperature gradients. The ampoule containing the source material is rotated while axial and radial air tubes are moved in opposite directions during crystal growth to maintain a desired distance and associated temperature gradient with respect to the growing crystal, whereby the crystal interface can advance in all directions, i.e., radial and axial according to the crystallographic structure of the crystal. Crystals grown by this method are particularly applicable for use as room-temperature nuclear radiation detectors.

4 Claims, 2 Drawing Figures

APPARATUS FOR GROWING HGI$_2$ CRYSTALS

The invention described herein was made in the course of, or under, Contract E(29-1)-1183 with the U.S. Energy Research and Development Administration.

This is a division of application Ser. No. 681,639, filed Apr. 29, 1976 now U.S. Pat. No. 4,030,964.

BACKGROUND OF THE INVENTION

This invention relates to a method and apparatus for growing mercuric iodide crystals, particularly to growing such crystals in a horizontal furnace, and more particularly an improved horizontal furnace growing method which utilizes controlled, movable radial and axial airflows for maintaining a desired temperature gradient during crystal growth.

Mercuric iodide (HgI$_2$) has shown good prospects as a high-Z material for use as a room-temperature nuclear radiation detector because of its large band gap ($\sim$ 2.1 eV). Single crystals of HgI$_2$ can be grown by various methods (see M. Schieber et al., J. of Crystal Growth, 24/25, 205, 1974), but experience has shown that crystals grown from the vapor phase are preferred for fabricating detectors, although very thin sections of solution-grown crystals can also be used. Crystals can be grown from the vapor phase in a system with a static temperature profile or by means of a temperature oscillation method.

The temperature oscillation method (TOM), which was initially developed by H. Scholz and co-workers (see Acta Electronic, 17, 69, 1974; Chem. Ing. Tech., 37, 1173, 1965; Crystal Growth, Oxford, Ed. H. S. Peiser, Pergammon, 475, 1967; and Philips Tech. Rev., 28, 316–319, 1967), consists of a periodic reversal of the temperature gradient between the source material and the crystal which causes alternating crystal growth and reevaporation or redissolution. The TOM has been successfully applied to the growth of HgI$_2$ from the vapor by H. Scholz (see Philips Tech. Rev. above), and was also used to grow GaP, $\gamma$Fe$_2$O$_3$, and NiFe$_2$O$_4$ by chemical vapor transport, CuS and CoS$_2$ by vapor transport, and Se by hydrothermal growth. Crystals of yttrium phosphate, arsenate, and vanadate were grown from the flux by superimposing periodic temperature oscillations on a linear cooling curve. The TOM has been mainly applied to the growth of HgI$_2$ in a vertical furnace which has both an axial and a radial gradient, and in a horizontal furnace which has only an axial gradient. The crystals grown in a vertical furnace were very large (up to 100-gram weight) but showed growth rings which represent inhomogeneities both in dislocation density and in impurity distribution. The crystals grown in a horizontal furnace (such as described and claimed in co-pending U.S. Patent application Ser. No. 592,481, filed July 1, 1975, in the name of M. M. Schieber et al.), being only an axial gradient, are small (up to 5-gram weight), but are free of growth inhomogeneities. Furthermore, it appears that there is a larger percentage of "good" crystals grown in a horizontal rather than in the vertical furnace, a "good" crystal being defined as one which has a mobility ($\mu$) times trapping time ($\tau$), $\mu\tau$ product for holes larger than 10$^{-6}$ cm$^2$/V. Thus, a need exists in the prior art for an HgI$_2$ crystal furnace which provides the advantages of each of the prior known vertical and horizontal furnaces without their above-mentioned associated disadvantages.

SUMMARY OF THE INVENTION

The present invention is directed to a method and apparatus for growing HgI$_2$ crystals which are large and homogeneous, thus combining the advantages of the prior known vertical and horizontal furnace growth techniques. Thus, the invention involves a horizontal furnace which has both an axial and a radial gradient. These gradients are accomplished by rotating the ampoule during crystal growth and supplying controlled, movable axial and radial airflows so that the crystal interface can advance in both the axial and radial directions according to the crystallographic structure of the crystal and the respective temperature gradient. Thus, large HgI$_2$ crystals (40 to 100 grams) may be produced without growth inhomogeneities, such crystals finding particular applications in room-temperature nuclear radiation detectors.

Therefore, it is an object of this invention to provide a method and apparatus for vapor phase growth of HgI$_2$ crystals.

A further object of the invention is to provide a horizontal furnace for growing large homogeneous HgI$_2$ crystals for use in nuclear radiation detectors.

Another object of the invention is to provide a method and apparatus for growing large homogeneous HgI$_2$ crystals utilizing a horizontal furnace with controlled, movable radial and axial airflows.

Another object of the invention is to provide a horizontal furnace for growing HgI$_2$ crystals which has both an axial and a radial temperature gradient.

Another object of the invention is to provide a method and apparatus for vapor phase growth of HgI$_2$ crystals wherein radial and axial airflows are utilized such that during crystal growth the crystal interface can advance in all directions.

Other objects of the invention will become readily apparent from the following description and accompanying drawings.

DESCRIPTION OF THE INVENTION

The invention involves a method and apparatus for vapor phase growth of mercuric iodide (HgI$_2$) crystals, which have particular application in room-temperature nuclear radiation detectors. Basically, the invention utilizes a horizontal furnace arrangement wherein the ampoule containing the source material is rotated with axial and radial controlled, movable airflows being directed about the ampoule forming axial and radial temperature gradients whereby the growing crystal interface can advance in all directions producing a large, homogeneous crystal within the ampoule.

Figure 1:
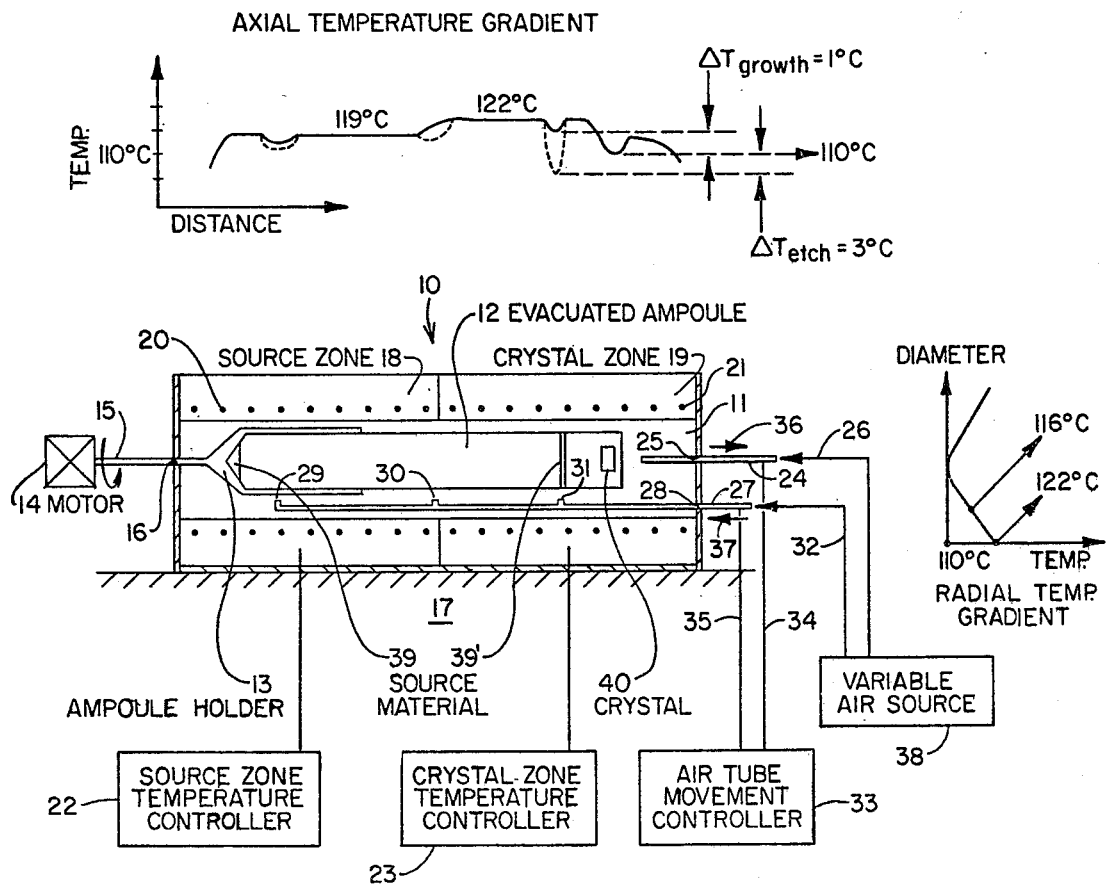
FIG. 1 schematically illustrates the apparatus and method of the invention for growing HgI$_2$ crystals.

Referring now to FIG. 1, the apparatus for growing HgI$_2$ crystals in accordance with the invention comprises a two-zone horizontal furnace, generally indicated at 10, having a heating box or chamber 11 in which is located an ampoule 12 mounted for rotation via an ampoule holder 13 connected to a motor 14 via a shaft 15 which extends through an aperture 16 in furnace 10. Ampoule 12 is evacuated and may be constructed of quartz or Pyrex with a length of 30 cm and diameter of 6 cm (12 × 2 ¼inches). The heating box 11 of furnace 10 has a length of 60 cm and diameter of 10 cm (24 × 4inches). Furnace 10 is mounted on a fixed support 17 and comprises a source zone 18 and a crystal zone 19, the zones being heated by electric heating coils 20 and 21, respectively. Source zone 18 is controlled by a temperature controller 22, while crystal zone 19 is controlled by a temperature controller 23, it being understood that an appropriate power supply (not shown) is connected to heating coils 20 and 21. (Note: The temperature profile of the furnace 10 is drawn immediately above the drawing of the furnace at the top of FIG. 1 and will be described in greater detail hereinafter.) The furnace 10 is constructed so that zones 18 and 19 can be independently maintained by the respective controllers 22 and 23 at separate, uniform temperatures with only a fairly short (one-half-inch) transition region between the two zones. A movable air tube or pipe 24 passes through an aperture 25 into the center of heating box 11 of furnace 10 to supply a radial airflow onto ampoule 12, with air tube 24 being connected to a variable air supply indicated by arrow 26. A movable air tube or pipe 27 passes through an aperture 28 into the lower portion of heating box 11 and extends along ampoule 12 for supplying an axial airflow thereabout, tube 27 being provided with three outlets 29, 30, and 31 directed toward ampoule 12 for reasons described hereinafter. Air tube 27 is connected to a variable air supply 30 as indicated by arrow 32. An air tube movement controller 33 is connected via actuation arms or members 34 and 35 to air tubes 24 and 27, respectively, for moving the tubes in opposite directions during crystal growth as indicated by arrows 36 and 37, respectively, as discussed below in greater detail. Air supply arrows 26 and 32 are connected to a variable air source, indicated generally at 38, which may constitute individually controlled variable volume blowers, for example, for supplying variable volumes of air to air tubes 24 and 27.

HgI$_2$ source material 39 is initially located at the left-hand end of ampoule 12 from which is formed at the right-hand end of the ampoule a crystal 40. Growing the crystal at the flat or right end of ampoule in the horizontal furnace, the source material 39 is separated by a distance (X) of 12 inches from the forming crystal 40, which distance was found to be undesirable. It was found that the distance (X) could be shortened considerably by blowing an axial airstream in different places or locations along the axial length of the ampoule. The cooling of the source 39 by air blowing is helpful to shorten the cycling periods of growth and etching (see FIG. 2). Blowing air at an axial distance of about 2 inches from the growing crystal 40 shortens the source-crystal distance (X) and produces a much sharper gradient $dT/dX$ which stabilizes the growing crystal interface and forces growth of a more perfect crystal. Thus, the blowing air in effect changes the distance (X) from the crystal 40 to about 2 inches by causing the source material 39 to deposit in polycrystalline form about the interior of ampoule 12 as indicated at 39' adjacent axial air outlet 31. The sharper $dT/dX$ is thus obtained by shortening $dX$ rather than by increasing $dT$ which in turn may have favored undesired spurious nucleation on the growing crystal and may have caused large overshoots in the temperature controller in the prior known horizontal furnace arrangements. Note the axial temperature gradient curve illustrated above the furnace 10 in FIG. 1 and the effect the axial air outlets 29, 30, and 31 have on the temperature as indicated by the dips in the curve shown by dotted lines directly above each of these axial air outlets.

In order to keep the crystal vapor interface at a constant $dT/dX$, the axial blowing air tube 27 is slowly moved toward the left side of the furnace, as indicated by arrow 37, in parallel with the movement of the growing surface of the growing crystal 40, thereby producing the axial temperature gradient illustrated above the furnace in FIG. 1. It should be noted that the radial temperature gradient, graphically illustrated to the right of furnace 10 in FIG. 1, is being produced by the radial airflow through air tube 24. In order to flatten the radial temperature gradient and allow the growth of larger diameter crystals, the radial air tube is pulled away from the flat (right-hand) end of ampoule 12 while the air flow is increased from 350 to 450 cc/min.

In terms of the temperature oscillation method (TOM), the crystals are grown by both the periodic oscillation of the source temperature (POST) and the periodic oscillation of the crystal temperature (POCT) methods.

Figure 2:
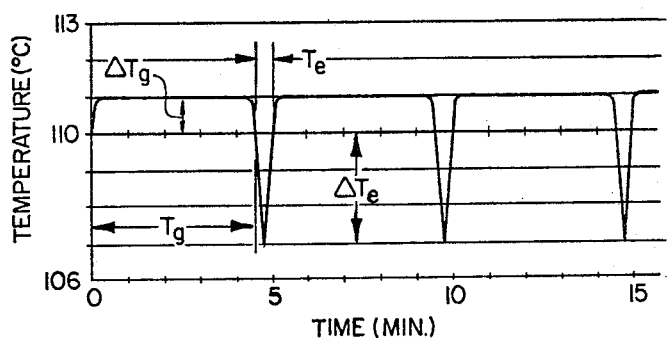
FIG. 2 graphically illustrates growth and reevaporation time periods and temperature differentials of the crystal growing method.

An example of a growth experiment utilizing the invention is as follows: An ampoule is cleaned with sulphachromic acid followed by a wash with detergent and followed by a rinse in high-purity methanol. At the end of each rinse between successive cleaning operations, the ampoule is washed with deionized water and degassed for two hours at 150° at a vacuum of $10^{-6}$ torr. Chemically pure HgI$_2$ source material, such as produced by Allied Chemicals, Morristown, New Jersey, is further purified by repeated sublimation in a continuously evacuated ampoule. The material is gradually transferred from one end to the other of the ampoule and this operation is repeated twice and the same operation is repeated again, also twice but not in a continuously pumped but rather in a pinched-off closed ampoule evacuated to $10^{-6}$ torr. The thus purified source material 39 is introduced into the growth ampoule 12 and a vacuum of $10^{-6}$ torr is created in the ampoule 12. The ampoule 12 is rotated by motor 14 at the rate of 1 rpm. The furnace 10 is maintained so that the source zone 18 is at 119° C. and the crystal zone 19 is at 122° C. (see the temperature curve above the furnace in FIG. 1). The temperature oscillation is obtained by switching the airflow through the axial air tube 27 between 1700 to 4500 cc/min. for growth and reevaporation (etching), respectively. The time periods of growth and reevaporation are 4 ½ and ½ minutes, respectively, and the temperature differential ΔT for growth and reevaporation are 1° C. and 3° C., respectively, using a mean temperature of 110° C., as illustrated in FIG. 2 and on the graph above the furnace in FIG. 1.

However, the crystal growth temperature may be oscillated over an overall range of about 90° C. to about 120° C. for various crystal growth applications, but in this application from about 107° C. to about 111° C.

At the beginning of a crystal growth operation, a single seed is caught by blowing a flow of 480 cc/min. air on the flat end of the ampoule 12 from radial air tube 24, thereby decreasing the temperature in crystal zone 19, and when one single seed, which should be as small as possible, does crystallize, the flow is decreased to 320 cc/min., thereby increasing the temperature in zone 19. During the growth of the crystal 40, the flow of radial air is increased gradually and the distance between the end of the radial air tube 24 and the ampoule 12 is increased gradually, as indicated by arrow 36, by about 1-2 mm/day so that the crystal interface can advance in all directions, i.e., radial and axial according to the crystallographic structure of the crystal and the respective temperature gradient, these gradients being shown by the respective curves adjacent furnace 10. During the growth of crystal 40, the axial air tube 27 is also moved gradually, as indicated by arrow 37, by about 1-2 mm/day so that the distance between the crystal interface and the source material 39' is kept constant and therefore the temperature gradient at which the crystal grows is kept constant. The end of the growth procedure is taking place when all of the source material is depleted. The radial flow of air at the end of the growth procedure is dependent on the amount of material that is charged in the ampoule. For example, in growing a 40-gram crystal, the radial flow at the flat end of the ampoule was 480 cc/min. Also, in growing a 40-gram crystal, the amount of source material utilized in the ampoule is 50 grams and the time of growth is 25 days.

A nuclear detector fabricated from a crystal grown by the above-described method and apparatus has a $\mu\tau$ product for electrons and holes of $8 \times 10^{-5}$ and $8 \times 10^{-6}$ cm$^2$/V, respectively.

It has thus been shown that the present invention provides:

1. A method and apparatus to grow HgI$_2$ crystals from the vapor phase in which the growth furnace is horizontal and the growth process uses the temperature oscillation method;

2. A method and apparatus in which air cooling of the source material provides shorter oscillation periods; and 3. A growth process by which the source material is brought close to the growing crystal interface.

While a particular embodiment of the apparatus and particular parameters of the method have been illustrated and/or described, modifications will become apparent to those skilled in the art, and it is intended to cover in the appended claims also such modifications as come within the spirit and scope of the invention.

What we claim is:

1. An apparatus for vapor phase growth of mercuric iodide crystals comprising: a horizontally extending furnace divided into two distinct temperature zones and having a central heating box extending through said temperature zones, means for independently controlling the temperature of each of said temperature zone, an evacuated ampoule containing purified mercuric iodide source material rotatably located in said heating box of said furnace and positioned substantially equally in each of said temperature zones, means connected to said ampoule for rotating same, air supply means comprising a tube extending into said heating box along the length of said ampoule and having a plurality of axially spaced radially inwardly directed outlets for providing spaced axial airflows along said ampoule, air tube means extending into said heating box for providing a radial airflow about at least one end of said ampoule, means for varying air flowing through said air supply means to provide controllably variable airflows along the length of said ampoule, and means for varying air flowing through said air tube means, and means for axially moving said air supply means in a direction axially away from said one end and said air tube means in an opposite directions axially away from said one end.

2. The apparatus defined in claim 1, wherein said means for rotating said ampoule comprises an ampoule holder secured to said ampoule and motor means connected to said ampoule holder.

3. The apparatus defined in claim 1, wherein said means for axially moving said air supply means and said air tube means comprises a controller mechanism and a pair of arm members connecting said controller mechanism with said air supply means and said air tube means.

4. The apparatus defined in claim 1, wherein said means for varying air flowing through said air supply means and said air tube means comprises a variable volume air source constructed to supply a varying volume of air individually to said air supply means and said air tube means.

* * * * *